United States Patent

Neukermans et al.

[11] Patent Number: 5,393,647
[45] Date of Patent: Feb. 28, 1995

[54] METHOD OF MAKING SUPERHARD TIPS FOR MICRO-PROBE MICROSCOPY AND FIELD EMISSION

[75] Inventors: Armand P. Neukermans, 3510 Arbutus Ave., Palo Alto, Calif. 94303; Timothy G. Slater, San Francisco, Calif.; Linda E. Whittlesey, Redwood City, Calif.; Sean S. Cahill, Cupertino, Calif.

[73] Assignee: Armand P. Neukermans, Palo Alto, Calif.

[21] Appl. No.: 92,780

[22] Filed: Jul. 16, 1993

[51] Int. Cl.⁶ .......................................... H01L 21/302
[52] U.S. Cl. ..................................... 430/320; 430/314; 437/228; 437/244; 156/662; 250/307
[58] Field of Search ................ 430/320, 313, 314, 323; 250/306, 307; 156/662; 437/228, 244

[56] References Cited

U.S. PATENT DOCUMENTS

| | | | |
|---|---|---|---|
| 4,123,571 | 10/1978 | Balog et al. | 427/249 |
| 4,685,996 | 8/1987 | Busta et al. | 156/628 |
| 4,916,002 | 4/1990 | Carver | 428/136 |
| 4,968,585 | 11/1990 | Albrecht et al. | 430/320 |
| 5,015,323 | 5/1991 | Gallagher | 156/345 |
| 5,032,545 | 7/1991 | Doan et al. | 437/242 |
| 5,051,379 | 9/1991 | Bayer et al. | 437/225 |
| 5,077,091 | 12/1991 | Nowak et al. | 427/255.2 |
| 5,201,992 | 4/1993 | Marcus et al. | 156/643 |

FOREIGN PATENT DOCUMENTS 0363134  4/1990  European Pat. Off. ............ 437/244

OTHER PUBLICATIONS

H. J. Kim et al., "Physical and Chemical Nature of Films Formed on Si(100) Surfaces Subjected to $C_2H_4$ at Elevated Temperatures", J. Electrochem. Soc. vol. 134 (9), pp. 2269–2275 (1987).

T. R. Albrecht et al., "Microfabrication of Cantilever Styli for the Atomic Force Microscope", J. Vac. Sci. Technol. A vol. 8 (4), pp. 3386–3396 (1990).

Graul et al., "Growth Mechanism of Polycrystalline B-SiC Layers on Silicon Substrate", Appl. Phys. Lett., vol. 21, No. 2 pp. 67–69 (1972).

Mogab et al., "Conversion of Si to Epitaxial SiC by Reaction with $C_2H_2$", J. Appl. Phys., vol. 45, No. 3, pp. 1075–1084 (1974).

Primary Examiner—Charles L. Bowers, Jr.
Assistant Examiner—John A. McPherson
Attorney, Agent, or Firm—Schneck & McHugh

[57] ABSTRACT

Forming micro-probe tips for an atomic force microscope, a scanning tunneling microscope, a beam electron emission microscope, or for field emission, by first thinning a tip of a first material, such as silicon. The tips are then reacted with a second material, such as atoms from an organic or ammonia vapor, at a temperature of about 1000° C. ±200° C. and vacuum conditions for several minutes. Vapors such as methane, propane or acetylene will be converted to SiC or WC while ammonia will be converted to $Si_3N_4$. The converted material will have different physical, chemical and electrical properties. For example, a SiC tip will be superhard, approaching diamond in hardness. Electrically conductive tips are suitable for field emission.

20 Claims, 3 Drawing Sheets

METHOD OF MAKING SUPERHARD TIPS FOR MICRO-PROBE MICROSCOPY AND FIELD EMISSION

TECHNICAL FIELD

The invention relates to micro-probe microscopy and field emmission and in particular to tips for same.

BACKGROUND ART

In micro-probe microscopy, such as atomic force microscopy (AFM), scanning tunneling microscopy (STM), beam electron emission microscopy (BEEM), and similar technologies, as well as field emission, all hereinafter designated as "micro-probe microscopy" or "MPM", high aspect ratio tips, with extremely sharp ends, are found to be highly desirable. These sharply pointed structures are used to probe atomic or subatomic forces associated with surfaces, sometimes forming images of the surfaces. It has been found in the past that silicon tips, formed by various processes of micromachining, are capable of providing the desired aspect ratios with sharp ends.

However, many such tips have been found to be relatively fragile, and in addition, they tend to stick to many species of materials of interest. Etched silicon tips are known to be oxidized very rapidly in air, and to be covered with a slowly increasing layer of oxide, consisting mostly of silicon monoxide. This substance is hygroscopic, and may be the basis for the increased sticking observed in these points, as compared say to pyramidal tips made of silicon nitride.

Others have recognized the value of harder tips. U.S. Pat. No. 4,968,585 to T. R. Albrecht et al. describes tips using $Si_3N_4$ and $Al_2O_3$. These tips are made by semiconductor manufacturing processes involving deposition of a film, such as $Si_3N_4$ on a Si surface. A pyramidal pit is etched as a mold before the film is applied and the film is patterned into a cantilever shape. A glass plate is bonded to the film as a support so that the Si can be etched away leaving the plate supporting the structure. The structure is coated with metal for support and then the glass is removed. If the Si layer had been left in place, the radius of the tip would have increased.

An object of our invention was to devise a method of manufacturing tips for MPM which yields tips with desired surface properties but which does not require multiple layering processes with dissimilar materials. Such a method would be simpler and could lead to sharp tips with superior properties.

DISCLOSURE OF THE INVENTION

The above object has been achieved by first forming a tip in a first material, such as silicon, as in the prior art, then thinning the tip to a high aspect ratio suitable for micro-probe microscopy. In our invention, we then react the tip in a heated, low pressure, vapor which will convert the tip to a desired superhard material, such as SiC, $Si_3N_4$, WC or $WSi_2$. Atoms of the first material are combined with atoms of the vapor to form the converted superhard tip. For SiC, an organic vapor may be a hydrocarbon such as methane or acetylene or another organic compound yielding a vapor reactive with silicon which forms a superhard and tough tip surface. Both the strength of the tip and its sticking coefficient are also improved relative to tips made by other methods. For $Si_3N_4$, ammonia vapor, $NH_3$, would be used.

Conversion of the tip in a gaseous ambient is different from overcoating the tip with a layer of carbide, nitride or other material. The layering processes of the prior art yield more rounded tips. On the other hand, the conversion process of the present invention allows very sharp tips, without loss of shape patterned in Si.

SiC is one of the hardest materials presently known, with a hardness of 9, thereby ranking close to diamond. Materials substantially harder than silicon are considered to be "superhard". Films of SiC are routinely used to coat cutting tools for wear and durability, while the powdered form of the material is one of the most commonly used abrasives. Filaments and fibers of it are used in conjunction with plastic to make space age materials. It is also extensively used for its inertness, for example as the material for susceptors in the semiconductor industry, because of its high resistance to oxidation even at elevated temperatures. Either the whole of the tip or the working end of the tip may be converted into derivatives of Si or W having superior hardness properties. Another advantage of SiC or WC tips for AFM is that the tips are sufficiently conductive to bleed off charge acquired by frictional contact. Thus, conversion of the tip changes physical, electrical and chemical properties of the base material.

BEST MODE FOR CARRYING OUT THE INVENTION

Figure 1:
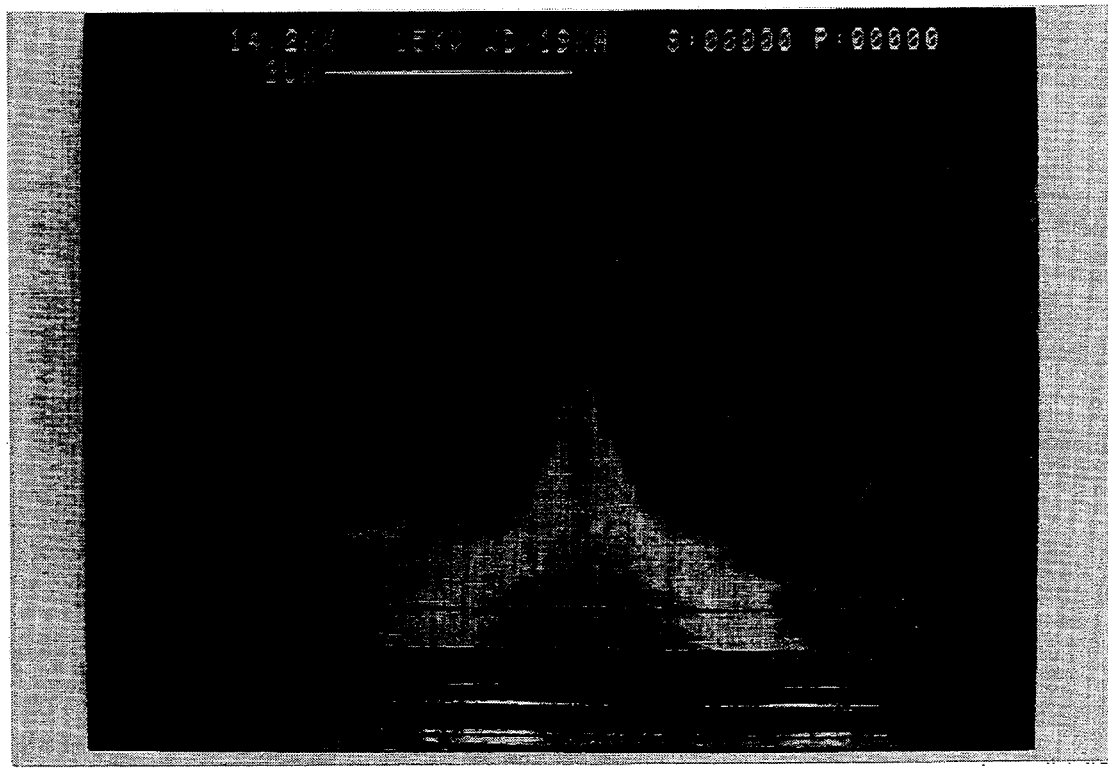
FIGS. 1 and 2 are scanning electron microscopy pictures of a micro-probe tip made in accord with the present invention.

A silicon tip on a silicon cantilever substrate is first made in a conventional process, for example as described in U.S. Pat. No. 4,968,585 to the point of forming silicon posts with any cap removed. This process involves use of semiconductor masking and etching techniques. A desired cantilever section is laid out on a silicon wafer with an integral tip section. Silicon is etched away in the cantilever section leaving a post at the tip section. The post is then sharpened using the technique described by Marcus et al. in Applied Physics Letters 56, no. 3, p. 226 (1990) until a high aspect ratio tip is formed. A high aspect ratio is commonly defined as the length of the tip exceeding the dimension of the base by at least five times. The technique of Marcus et al. involves repeated oxidation and removal of oxide. However, our invention is not limited to this method, and may be used with any process that produces a tip, with a shape roughly suited to AFM before final shaping. Final shaping may be by any suitable method such as ion beam etching of silicon, reactive ion or plasma etching or various wet etch processes, including electrochemical processes. When the formation of the tip is finished, the tip, which is free from oxide at this point is placed in a reactive environment, generally in a partial vacuum and at a temperature in the neighborhood of 1000° C. and the surface of the silicon or other base material is converted into the material of choice. As the tip is very thin it is possible to convert the critical parts of the tip completely, if so desired, while coating the rest of it with a layer of the reactant material. The conversion process is not dependent on the shaping process which is used.

For example, numerous examples in the literature describe the conversion of a Si surface to a SiC surface, when the Si surface is exposed at high temperature to hydrocarbon compounds. This can be done at atmospheric pressure, or preferably at reduced pressure.

The method of J. Graul and E. Wagner, described in Applied Physics Letters, 21, no. 2, p. 67 (1972) relates to conversion of monocrystalline silicon to polycrystalline $\beta$-silicon carbide using methane. In our use of this method Si posts are placed on a pedestal inside of an evacuated reactor. The pedestal is inductively or otherwise heated to about 1200° C. Using hydrogen as a carrier gas, methane is introduced into the reactor under vacuum conditions in a flow through system. Some of the methane decomposes and SiC forms at the tips. SiC film thickens inwardly as more silicon is converted if the process is continued beyond a few minutes. Because only a layer 100 Å deep needs to be converted, conversion times of a few minutes, i.e. in the range of 2–20 minutes, are typical.

SiC tips can also be formed using acetylene or almost any aliphatic gaseous compound, rather than methane, as the organic reactive gas. The method of C. J. Mogab and H. J. Leamy, described in Applied Physics Letters, 45, no. 3, p. 1075 (1974) relates to conversion of monocrystalline silicon to $\beta$-silicon carbide using acetylene in a vacuum of $10^{-7}$ to $5 \times 10^{-4}$ Torr at temperatures between 800° and 1100° C.

Figure 2:
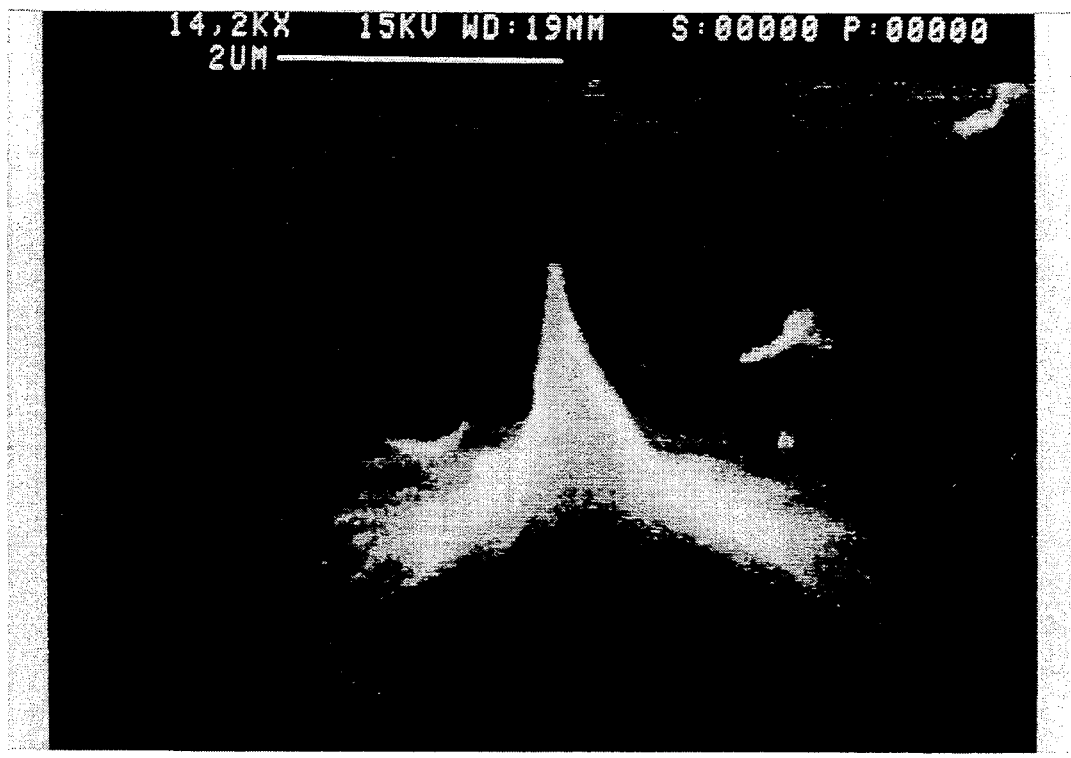

FIGS. 1 and 2 show a SiC tip made in accord with our invention using the procedure of Mogab et al., except using propane, $C_3H_8$ as the organic reactive gas. FIG. 1 shows a thinned tip before reacting with a reactive gas. FIG. 2 shows the same tip after the reacting step. No visible change in the aspect ratio has occurred. The tip has sides that arch upwardly following a curve that appears exponentially steep at the center. The height of the tip is more than 5 micrometers and the base dimension is about one micrometer.

Figure 3:
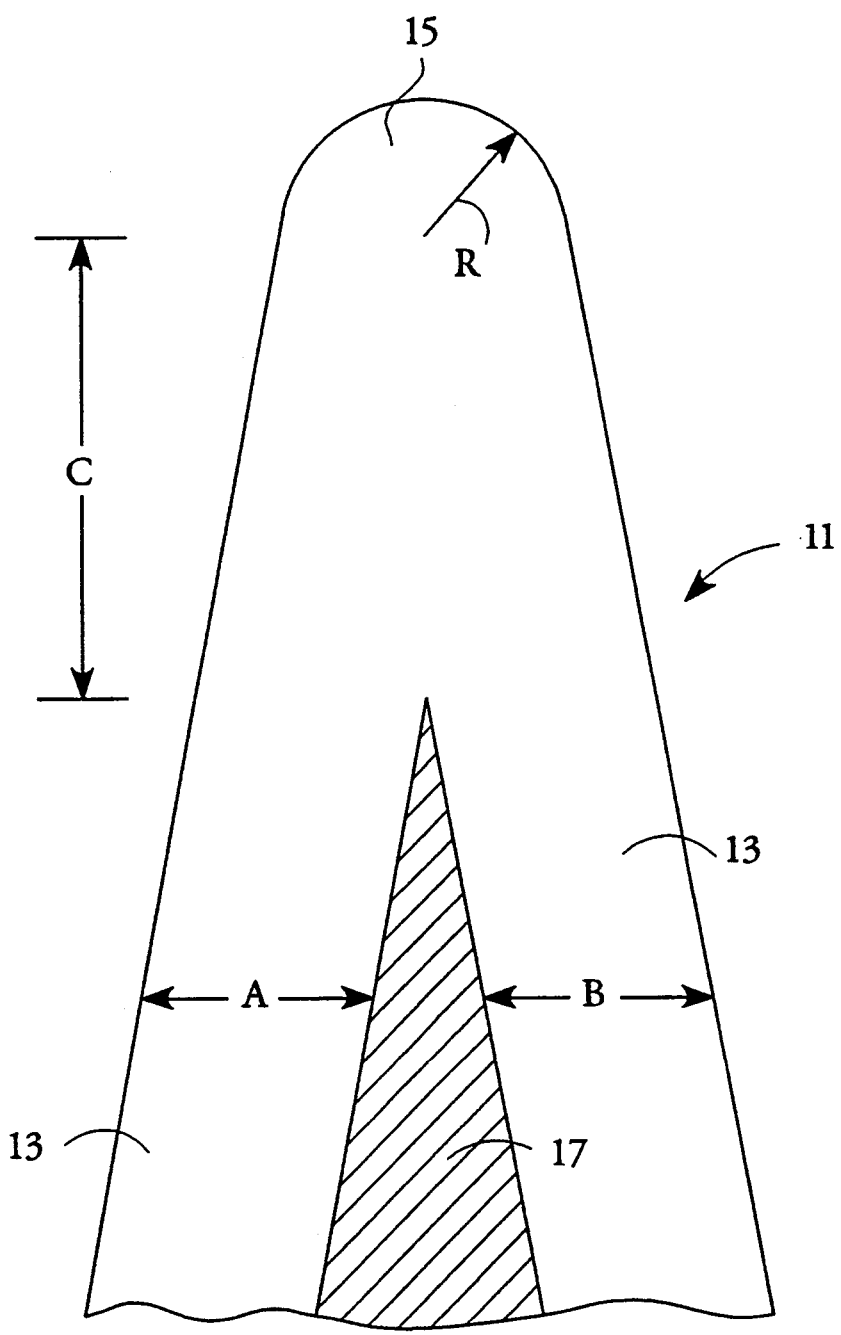
FIG. 3 is a plan view of a micro-probe tip in accord with the present invention.

Even if the conversion of SiC extends only 200 Å deep, then the top 500 Å to 1000 Å of the tip will virtually be completely converted to the coating material. In FIG. 3, outer zones 13 of tip 11 are reacted to form SiC. The dimensions A and B are 200 Å each. A rounded tip may form at apex region 15 having an estimated radius of about 100 Å indicated by arrow R, but conditions for forming rounded tips are not understood and rounding cannot be predicted. The rounding of the tip would give the tip a stylus quality, avoiding tendency to fracture if the tip tapered to a hair-like point, as well as reducing the tendency to stick to material. An unreacted silicon zone 17 lies beneath the reacted regions. In this manner, the working end of the tip which comes in contact with the sample is completely converted, even though the inner shaft has not reacted. The length of the completely converted portion, indicated by arrow C, is about 500 Å. Very short reaction times of a few minutes are all that is required to provide almost complete conversion.

The above procedures can be readily executed in commercially available rapid thermal anneal stations (RTA), rapid thermal oxidation or nitridation systems, or other CVD reactors by using the appropriate ambient.

Another example of a hard finish involves $Si_3N_4$. To grow silicon nitride, an appropriate source of nitrogen such as ammonia needs to be used. Because of its relative stability, nitrogen gas, although usable, is less desirable as it does not decompose readily. It can also be prepared by plasma anodic nitridation in a nitrogen-hydrogen plasma at lower temperatures (700°–900° C.) or in an ammonia plasma. In plasma nitridation, the silicon tip is placed in a vacuum chamber in the vicinity of a pair of electrodes. A nitrogen-containing gas, such as ammonia, $NH_3$ is introduced into the chamber. A gas ionizing, a.c. voltage is applied to the electrodes, activating the ionized gas and accelerating ions through the chamber, some of which will encounter the tip and react with silicon to form a hard and tough $Si_3N_4$ layer having a thickness of at least 100 Å. Thermal nitridation is a well established technology in the semiconductor industry. It provides for very good quality films, but usually very thin (50–100 Å), as the growth kinetics are self-limiting.

Tips coated with $Si_3N_4$ are usually non-conducting, as the nitride tends to be a very good insulator under normal conditions. However, its inertness offsets this particular difficulty. Mixtures of oxi-nitrides or carbo-nitrides, prepared with gases which supply oxygen, carbon and nitrogen, are used to vary conductivity, depending on the application for the tips. Other organic vapors may also be reacted with the silicon tips to form the superhard tips of the present invention.

Tungsten is a material which can be deposited in molecular form on a silicon tip from $WF_6$. If the tungsten coated tip is heated without introduction of an organic vapor, tungsten silicide will form and this is a superhard tip material. On the other hand, a tungsten carbide tip, WC, can be formed by reacting a tungsten wire in an aliphatic gas in a reaction vessel. The thin tungsten wire may be formed by etching a larger tungsten wire to a fine wire having a desired shape. After etching the wire is reacted as described using an aliphatic compound, such as methane, propane or acetylene.

Tips which are electrically conductive can be used as field emission tips. Here the increased hardness is expected to provide longer life, as damage from ion impact would be minimized.

We claim:

1. A method of making superhard tips for microprobe microscopy or field emission comprising,
   etching a tip of a first material,
   thinning the tip to a desired shape and aspect ratio suited to atomic force microscopy, and
   reacting the tip at an elevated temperature with an organic or ammonia vapor until at least an outer portion of the tip is converted to a compound having atoms of the first material and atoms of the vapor while essentially maintaining said shape and aspect ratio, the converted compound having changed physical, chemical and electrical properties with respect to the first material.

2. The method of claim 1 wherein said first material is silicon.

3. The method of claim 1 wherein said first material is tungsten.

4. The method of claim 1 wherein said vapor is an aliphatic compound.

5. The method of claim 4 wherein said aliphatic compound is acetylene, methane or propane.

6. The method of claim 2 wherein said converted compound is silicon carbide.

7. The method of claim 1 wherein said converted compound is electrically conductive.

8. The method of claim 2 wherein said converted compound is silicon nitride.

9. The method of claim 2 wherein said converted compound is tungsten carbide.

10. The method of claim 1 wherein said converted compound is SiC and said reacting step is carried out at a temperature greater than 800° C. and less than 1100° C.

11. The method of claim 1 wherein said reacting step is carried out at least until a surface layer of the tip having a thickness of 100 Å consists essentially of said converted compound.

12. The method of claim 1 wherein said desired aspect ratio is at least 3 to 1.

13. A method of making tips for micro-probe microscopy or field emission comprising,
    patterning and etching a silicon post on a support member,
    shaping the post into a silicon tip having a desired sharpness and aspect ratio for atomic force microscopy and an essentially oxide-free surface,
    reacting the tip with an organic or ammonia vapor, thereby converting at least a portion of the surface of the tip into a material harder than silicon, including maintaining said sharpness and aspect ratio.

14. The method of claim 13 wherein said organic vapor is an aliphatic compound.

15. The method of claim 14 wherein said aliphatic compound is methane, acetylene or propane.

16. The method of claim 13 wherein said converted material is silicon carbide.

17. The method of claim 13 wherein said converted material is silicon nitride.

18. The method of claim 13 wherein said reacting step is carried out for a time between 2 and 20 minutes.

19. The method of claim 13 wherein said reacting step is carried out until a working end of the tip is converted to said material harder than silicon.

20. The method of claim 13 wherein said reacting step is carried out at least until the top 100 Å of the tip is completely converted to said material harder than silicon.

* * * * *